(12) United States Patent
Aoki et al.

(10) Patent No.: US 7,327,040 B2
(45) Date of Patent: Feb. 5, 2008

(54) MODULE SUBSTRATE AND DISK APPARATUS

(75) Inventors: Makoto Aoki, Fukaya (JP); Kuniyasu Hosoda, Hanno (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/273,953

(22) Filed: Nov. 15, 2005

(65) Prior Publication Data
US 2006/0103030 A1 May 18, 2006

(30) Foreign Application Priority Data
Nov. 16, 2004 (JP) .............................. 2004-331979

(51) Int. Cl.
*H01L 23/48* (2006.01)
(52) U.S. Cl. ...................... 257/778; 257/737; 257/723
(58) Field of Classification Search ................. 257/769
See application file for complete search history.

(56) References Cited

U.S. PATENT DOCUMENTS

| | | | |
|---|---|---|---|
| 5,473,118 A | 12/1995 | Fukutake et al. | |
| 6,291,264 B1 | 9/2001 | Tang et al. | |
| 6,297,564 B1 * | 10/2001 | Chung | 257/783 |
| 6,639,155 B1 | 10/2003 | Bupp et al. | |
| 6,707,162 B1 | 3/2004 | Ho et al. | |
| 2001/0013653 A1 * | 8/2001 | Shoji | 257/738 |
| 2004/0212030 A1 * | 10/2004 | Asai | 257/432 |
| 2005/0028361 A1 * | 2/2005 | Yin et al. | 29/841 |
| 2005/0042894 A1 * | 2/2005 | Wu et al. | 439/66 |
| 2005/0073035 A1 * | 4/2005 | Moxham | 257/678 |

FOREIGN PATENT DOCUMENTS

| | | |
|---|---|---|
| JP | 06-326445 | 11/1994 |
| JP | 2001-102700 | 4/2001 |

* cited by examiner

*Primary Examiner*—Leonardo Andujar
*Assistant Examiner*—Krista Soderholm
(74) *Attorney, Agent, or Firm*—Blakely, Sokoloff, Taylor & Zafman LLP

(57) ABSTRACT

A module substrate includes an insulating substrate, a circuit pattern formed on at least a main surface of the insulating substrate, a protection film formed on the main surface of the insulating substrate including the circuit patter such as to expose a mount region of the circuit pattern, an active element part mounted on the mount region of the circuit pattern, a fluororesin film formed on the protection film at least in a vicinity of the mount region of the active element part, and an underfill filled between the active element part and the mount region of the circuit pattern.

15 Claims, 7 Drawing Sheets

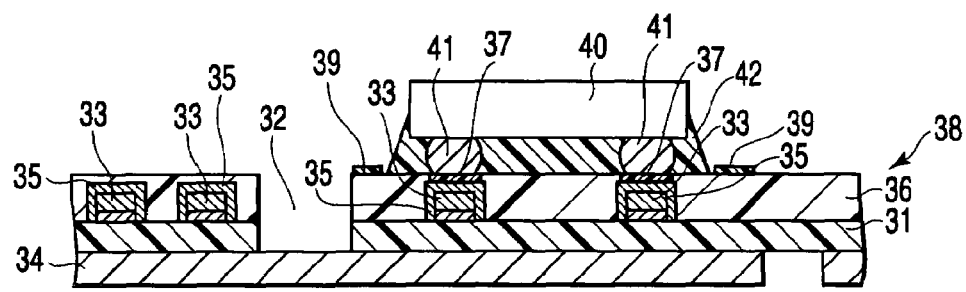
F I G. 3
F I G. 4 A
F I G. 4 B
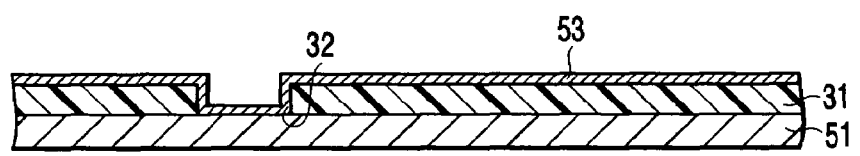
F I G. 4 C
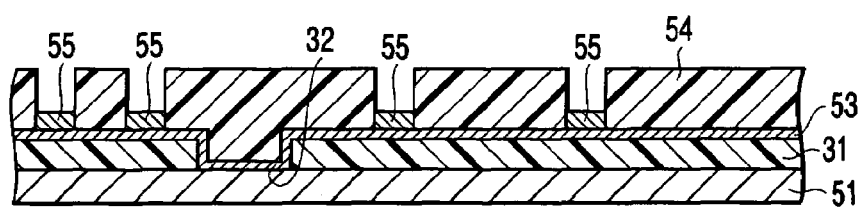
F I G. 4 D

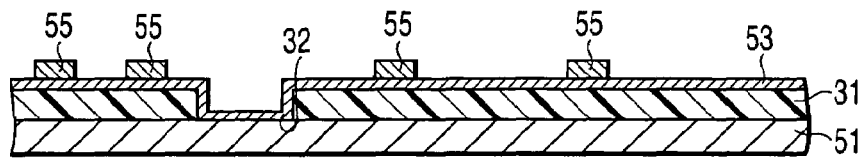
F I G. 4 E
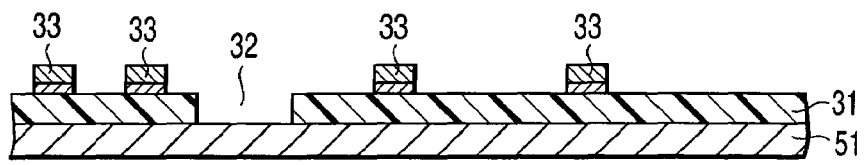
F I G. 4 F
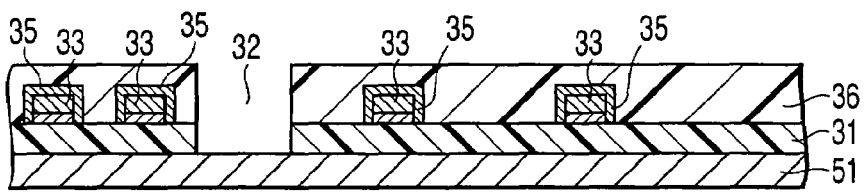
F I G. 4 G
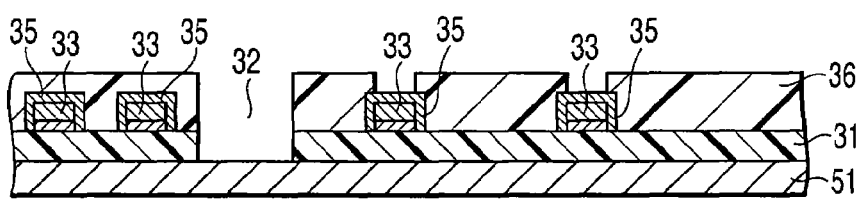
F I G. 4 H
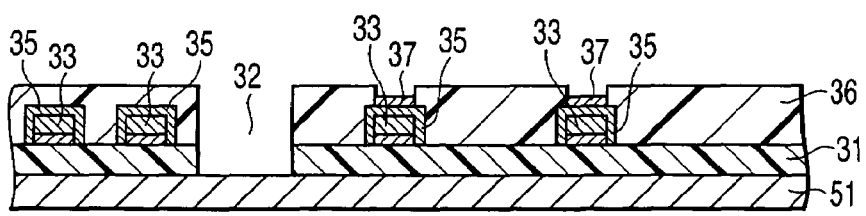
F I G. 4 I

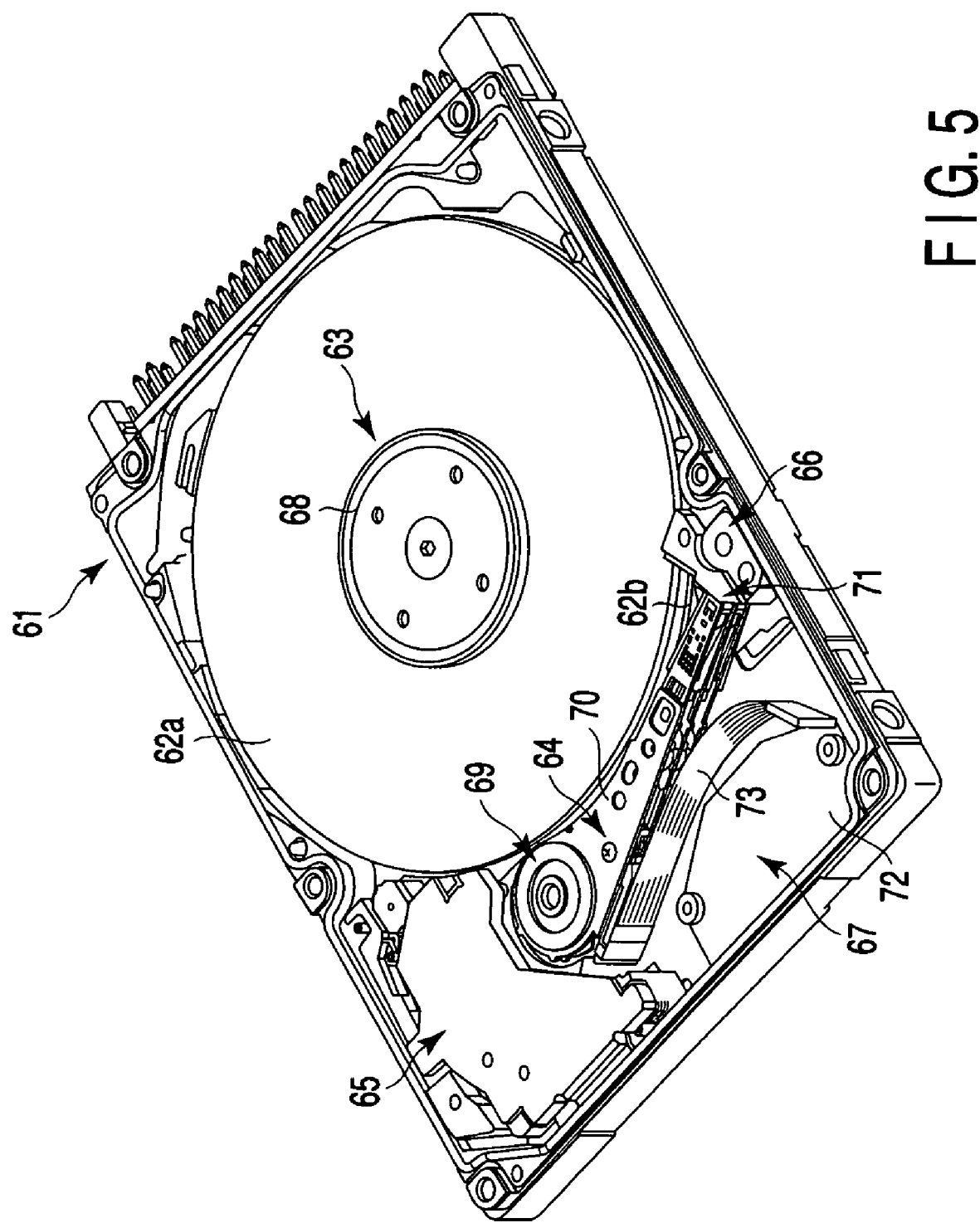
F I G. 5

MODULE SUBSTRATE AND DISK APPARATUS

CROSS-REFERENCE TO RELATED APPLICATIONS

This application is based upon and claims the benefit of priority from prior Japanese Patent Application No. 2004-331979, filed Nov. 16, 2004, the entire contents of which are incorporated herein by reference.

BACKGROUND OF THE INVENTION

1. Field of the Invention

One embodiment of the present invention relates to a module substrate and disk apparatus.

2. Description of the Related Art

As a conventionally known substrate, there is a module substrate in which active element parts including bare chips are mounted in a circuit pattern of a printed wiring board. When mounting active element parts in the circuit pattern of the print wiring board in the conventional module substrate, first, the electrodes of the active element parts are soldered to the circuit pattern of the printed wiring board. Then, a resin solution for formation of underfill is injected between the printed wiring board and the active element parts, and cured to form an underfill. In this manner, the mechanical fixation and the like of the active element parts to the printed wiring board are assured.

However, while injecting the resin solution for forming underfill, the resin solution, in some cases, flows out from the region where the active element parts of the printed wiring board are mounted to spread to peripheral parts, and therefore the following problems may occur. That is, for example, in a module substrate that uses a printed wiring board in which a rigid insulating substrate made of an epoxy resin as its main material is built, the spreading of the underfill to peripheral parts creates a trouble in replacement of an active element part. On the other hand, in a module substrate that uses a printed wiring board in which a flexible insulating substrate made of a polyimide film is built, the part of the substrate where the underfill spread loses its flexibility since the underfill is made of a cured resin of a high property as its main ingredient. Further, if the film is bent at a part where the underfill is spread, the portion of the underfill peels off to create dust, and therefore in the case of a disk apparatus, a medium loaded in the apparatus may be adversely affected.

As a solution to the above-described problems, U.S. Pat. No. 6,707,162 discloses such a technique that an alignment region is provided for each circuit pattern portion of a printed wiring board in which active element parts to be mounted are fixated with an underfill, so as to expand the intervals. Another solution is disclosed in U.S. Pat. No. 6,291,264, in which a trench is provided to stop flow-out of an underfill during the fixation of active element parts with the underfill. However, as the density of mounted parts has been increased, such an arrangement of the parts that considers a clearance for the flow-out of the underfill solution, or the formation of a trench is very difficult in practice.

On the other hand, Jpn. Pat. Appln. KOKAI Publication No. 2001-102700 discloses a flexible printed wiring board that can prevent disconnection even after a great number of times (for example, about 10,000 times) of open/close operation as in the case of a mobile phone. This flexible printed wiring board is provided for, for example, a hinge portion of a foldable type mobile phone, which is repeatedly bent and stretched, and has such a structure that a metallic layer of a circuit pattern or the like, is interposed between a pair of films and at least one of these films is made of a friction resistance member or an abrasion resistance member.

Further, Jpn. Pat. Appln. KOKAI Publication No. 6-326445 discloses a circuit board in which a heat-resisting insulating agent having such properties that reject fused solder (that is, for example, a heat-resisting insulating agent that is made of an amorphous fluororesin as its main component) is attached to the surface of each of solder-resist films formed to be distant from each land of a wiring pattern.

BRIEF DESCRIPTION OF THE SEVERAL VIEWS OF THE DRAWING

FIG. 3 is an exemplary diagram showing a cross section of a module substrate according to a second embodiment of the present invention;

FIGS. 4A, 4B, 4C, 4D, 4E, 4F, 4G, 4H, 4I, 4J, 4K, 4L and 4M each are an exemplary diagram showing a cross section of the module substrate according to the second embodiment in each respective step of its process by which the substrate is manufactured;

FIG. 5 is an exemplary perspective view showing a hard disk drive (to be called HDD hereinafter) serving as a disk apparatus according to a third embodiment of the present invention.

DETAILED DESCRIPTION OF THE INVENTION

Module substrates and disk apparatus according to embodiments of the present invention will now be described in detail with reference to accompanying drawings.

First Embodiment

Figure 1:
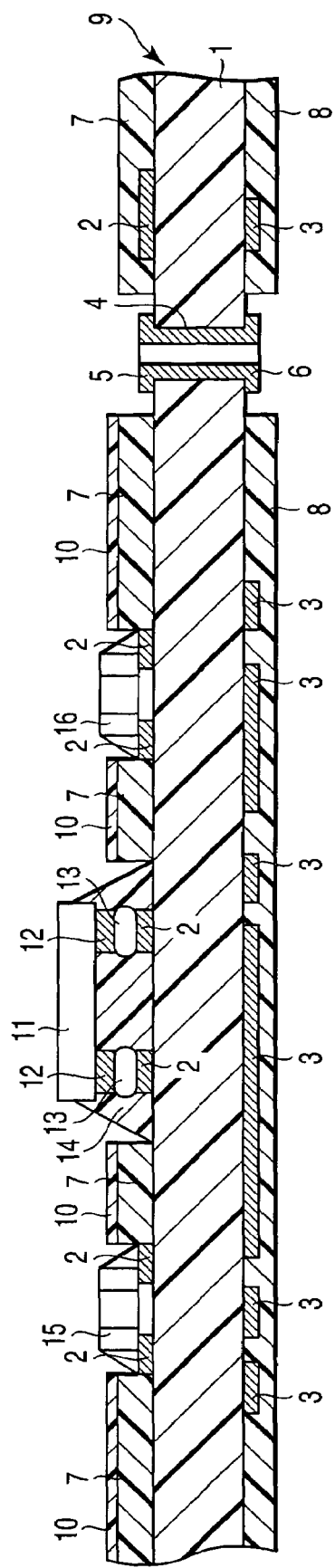
FIG. 1 is an exemplary diagram showing a cross section of a module substrate according to a first embodiment of the present invention.

FIG. 1 is an exemplary diagram showing a cross section of a module substrate equipped with a printed wiring board including a rigid insulating substrate, according to the first embodiment of the present invention.

A rigid insulating substrate 1, which is made of, for example, a glass epoxy resin, has circuits patterns 2 and 3 formed on top and bottom surfaces, respectively. A through-hole 4 is formed to be through the rigid insulating substrate 1. Lands 5 and 6 are formed in vicinities of openings at both ends of the through hole 4, respectively. Solder resist films 7 and 8, which serve as protection films, are formed on the top and bottom surfaces of the rigid insulating substrate 1 to cover the circuit patterns 2 and 3, respectively. The solder resist film 7 formed on the top surface side has openings at portions of the circuit pattern 2 where parts of active elements and passive elements are mounted, and at a section of the land 5. The solder resist film 8 formed on the rear surface side has an opening at a section of the land 6. With the above-described structure, the rigid insulating substrate 1, the circuits patterns 2 and 3, the through-hoe 4 that includes the lands 5 and 6, and the solder resists 7 and 8 form a rigid printed wiring board (to be called RPC hereinafter) 9.

A fluororesin film 10 is applied on at least the sections of the solder resist film 7, which are located in the vicinities of the regions where the parts of the active elements are mounted.

An electrode 12 of an active element part such as a bare chip 11 is connected by a solder material 13 to a respective portion of the circuit pattern 2, that is exposed from an opening (mount region) of the solder resist film 7 on the top surface side of the RPC 9. An underfill 14 is provided between the insulating substrate 1 and the bare chip 11 in the mount region, to mechanically fix the bare chip 11 to the insulating substrate 1. Passive element parts such as chip resistors 15 and 16 are connected to respective portions of the circuit pattern 2, which are exposed from respective openings (mount regions) of the solder resist film 7 on the top surface side of the RPC 9.

Other than the bare chip, usable examples of the active element parts are a chip size package (CSP), a ball grid array (BGA), a plastic ball grid array (PBGA), a plastic fine pitch ball grid array (PFBGA), a stacked plastic fine pitch ball grind array (Stacked PFBGA) and a flip chip ball grind array (FCBGA).

Besides the chip resistor, a chip capacitor, for example, can be used as the passive element part.

Usable examples of the fluororesin are polytetrafluoroethylene (PTFE), tetrafuluoroethylene-perfluoroalkylvinylether copolymer (FEP), tetrafuluoroethylene-ethylene copolymer (ETFE), polyvinylidene fluoride (PVDF) and polychlorotrifluoroethylene (PCTFE).

It is desirable that the fluororesin film should have a thickness of 5 to 50 μm, and more preferably a thickness of 5 to 20 μm.

The underfill is made of, for example, an epoxy resin filled with a filler. An example of the filler is silica fine powder. The silica fine powder is blended at a ratio of 30 to 70 wt % to a total amount of the epoxy resin and the silica fine powder. Such an underfill that contains an epoxy resin and silica fine powder is commercially available, for example, under a tradename of FP 4511 or FP 4546 of Henkel Japan, Ltd.

Next, a method of manufacturing a module substrate shown in FIG. 1 will now be described with reference to FIGS. 2A to 2F.

Figure 2A:
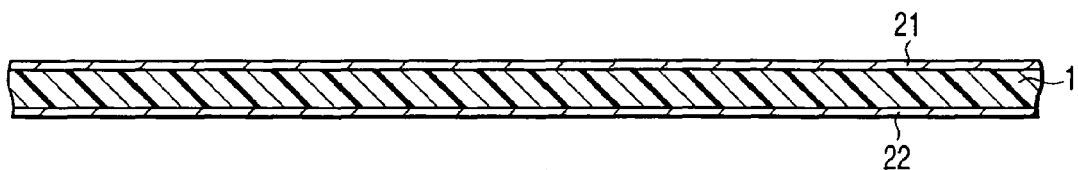
FIGS. 2A, 2B, 2C, 2D, 2E and 2F each are an exemplary diagram showing a cross section of the module substrate according to the first embodiment in each respective step of its process by which the substrate is manufactured.
Figure 2B:
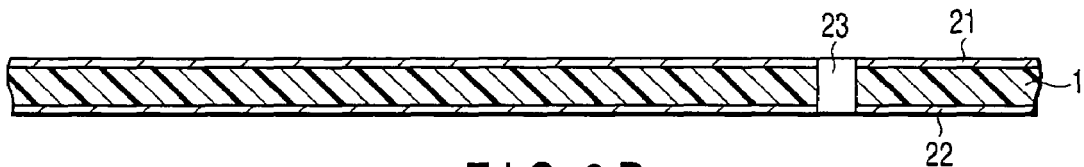
Figure 2C:
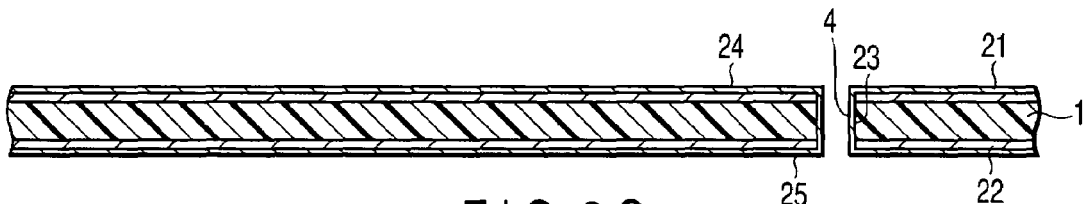

First, as shown in FIG. 2A, copper foils 21 and 22 are attached respectively to the top and bottom surfaces of the rigid insulating substrate 1 made of, for example, a glass epoxy resin, and thus a so-called both-side copper-foiled board is prepared. Next, as shown in FIG. 2B, a hole 23 is made through the both side copper foiled board with a drill or the like. Subsequently, the resultant is subjected to electroplating (for example, electric copper plating) to form electric copper plating films 24 and 25 on the copper foils 21 and 22, respectively as shown in FIG. 2C. At the same time, a thorough-hole 4 is formed at a section of the hole 23.

Figure 2D:
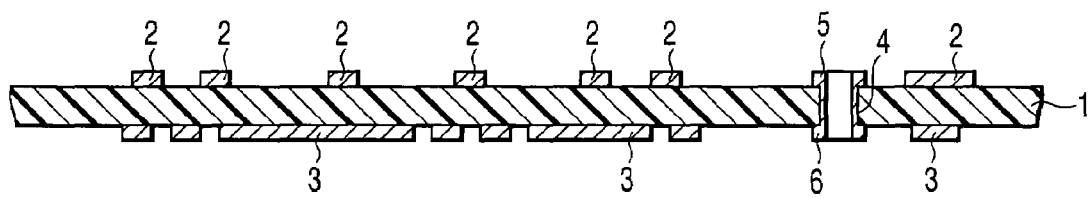
Figure 2E:
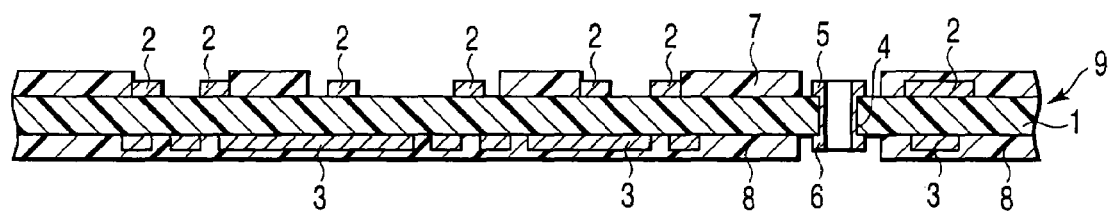
Figure 2F:
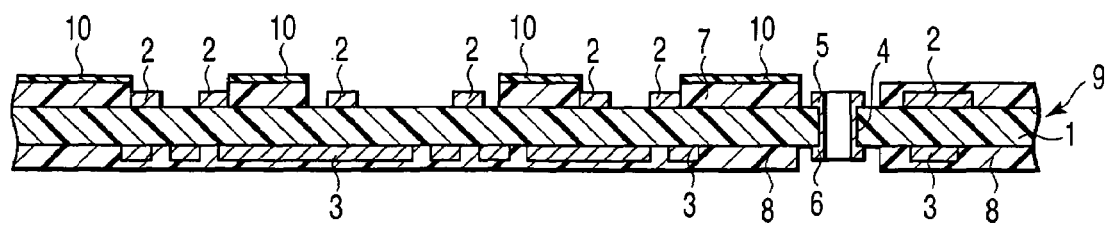

Subsequently, as shown in FIG. 2D, the copper foils 21 and 22 and the electric copper plating films 24 and 25 formed on the top and bottom surfaces of the rigid insulating substrate 1 are selectively etched using a resist pattern (not shown in the figure) as the mask. Thus, the circuit patterns 2 and 3 and the lands 5 and 6 which are communicated with the thorough-hole 4 are formed on the top and bottom surfaces of the rigid insulating substrate 1. Then, as shown in FIG. 2E, the solder resist films 7 and 8 are formed respectively on the top and bottom surfaces of the rigid insulating substrate 1 that includes the circuit patterns 2 and 3 and the lands 5 and 6 such that the portions of the circuit pattern 2, where the active element parts and passive element parts are mounted, and the section of the land 5 are opened. Thus, the rigid printed wiring board (RPC) 9 is manufactured. Next, as shown in FIG. 2F, the fluororesin film 10 is formed on at least portions of the solder resist film 7, which are located in vicinities of the regions where the active element parts are mounted. The fluororesin film 10 can be formed by employing a method of adhering a film-type fluororesin of a desired pattern on the solder resist film 7 with an adhesive or a method of applying a fluororesin solution on the solder resist film 7 with a printing technique, followed by printing.

After that, as shown in FIG. 1 mentioned above, the electrode 12 of the active element part such as bare chip 11 is connected by the solder material 13 to a respective portion of the circuit pattern 2, which is exposed from an opening (mount region) of the solder resist film 7 on the top surface side of the RPC 9. In this mount region, an underfill-forming resin solution (for example, a solution of epoxy resin containing a filler) is dropped from, for example, a dispense nozzle into a gap between the insulating substrate 1 and the bare chip 11, followed by drying and curing. In this manner, an underfill 14 is formed to mechanically fix the bare chip 11 to the insulating substrate 1. Further, passive element parts such as chip resistors 15 and 16 are mounted to the respective portions of the circuit pattern 2, which are exposed from the respective openings (mount regions) of the solder resist film 7 on the top surface side of the RPC 9. With the steps described above, the bare chip 11, chip resistors 15 and 16, and the like are mounted to the RPC 9, thereby manufacturing a module substrate.

As described above, according to the first embodiment, the portions of the solder resist film 7 of the printed wiring board 9, which are located in the vicinities of at least the active element parts mount regions are coated with the fluororesin film 10 that is hard to get wet and has a high water repellency. With this structure, it is possible to prevent the underfill 13 from spreading from the mount region of the bare chip 11 of the printed wiring board 9 to the peripheral parts during the operation of connecting the electrode 12 of the active element part such as bare chip 11 via the solder material 13 to the respective portion of the circuit pattern 2 to mechanically fix the bare chip 11 to the insulating substrate 1 with underfill 13 in the respective mount region. Therefore, there is no need to provide a dam or trench to prevent the flow-out of the solution unlike the conventional technique, and it is possible to narrow the interval between parts. Consequently, it is possible to realize a module substrate in which bare chip 11 and the like are mounted at a high density.

In the meantime, when an active element part 11 becomes defective and needs to be replaced with a new part in the module substrate in which active element parts 11 are mounted in a printed wiring board 9 including the rigid insulating substrate 1, it is possible to prevent the underfill 13 from spreading from the mount region of the active element part 11 of the printed wiring board to the peripheral parts. In this manner, the replacement of the active element part can be easily conducted without damaging the peripheral parts.

It should be noted that in the first embodiment, a rigid printed wiring board in which circuit patterns are formed respectively on both surfaces thereof, but the present invention is not limited to such a structure. For example, it is alternatively possible to use a rigid printed wiring board with a circuit pattern formed on only one surface thereof, or a rigid multi-layered printed wiring board with an inner layer circuit pattern formed inside.

Second Embodiment

FIG. 3 is an exemplary diagram showing a cross section of a module substrate equipped with a flexible printed wiring board including a flexible insulating substrate, according to the second embodiment of the present invention.

A flexible insulating substrate 31 made of, for example, polyimide, has an opening portion 32 formed regionally. A circuit pattern having a layered structure of, for example, Cr/Cu and Cu is formed on a top surface of the flexible insulating substrate 31, and a backing plate 34 made of, for example, SUS is formed on a bottom surface (at least a section corresponding to an active element part, which will be described later). Exposed surfaces of the circuit pattern 33 are each covered with, for example, a Ni thin film 35. A coverlay 36 made of, for example, polyimide, which serves as a protective film, is formed on the flexible insulating substrate 31 that includes the circuit pattern 33. The coverlay 36 has openings each at a section corresponding to that of a respective portion of the circuit pattern 33, in which active element parts are mounted. For example, an Ni/Au thin film 37 is formed on a respective Ni thin film 35 of the respective portion of the circuit pattern 33 exposed from the respective opening. As described above, the flexible insulating substrate 31, the circuit pattern 33, the Ni thin films 35, the Ni/Au thin films 27, the backing plate 34 and the coverlay 36 form a flexible printed wiring board (to be called FPC hereinafter) 38.

The fluororesin 39 is applied on at least the sections of the coverlay 36, which are located in the vicinities of the regions where the parts of the active elements are mounted.

The electrode (not shown) of the active element part (for example, a bare chip) 40 is connected via a solder material 41 to the Ni/Au thin film 37 of the respective portion of the circuit pattern 33 exposed from the respective opening (mount region) of the coverlay 36 of the FPC 38. The underfill 42 is provided between the coverlay 36 and the bare chip 40 in the mount region, thereby mechanically fixing the bare chip 11 to the coverlay 36.

As mentioned in connection with the first embodiment, usable examples of the active element parts, other than the bare chip, are a chip size package (CSP), a ball grid array (BGA), a plastic ball grid array (PBGA), a plastic fine pitch ball grid array (PFBGA), a stacked plastic fine pitch ball grind array (Stacked PFBGA) and a flip chip ball grind array (FCBGA).

As the fluororesin, similar ones to those mentioned in the first embodiment can be employed. It is preferable that the fluororesin film should have a thickness of 5 to 50 µm.

The underfill is made of, for example, an epoxy resin filled with a filler. An example of the filler is silica fine powder. The silica fine powder is blended at a ratio of 30 to 70 wt % to a total amount of the epoxy resin and the silica fine powder. Such an underfill that contains an epoxy resin and silica fine powder is commercially available, for example, under a tradename of FP 4511 or FP 4546 of Henkel Japan, Ltd.

Next, a method of manufacturing a module substrate shown in FIG. 3 will now be described with reference to FIGS. 4A to 4M.

First, as shown in FIG. 4A, a photosensitive polyimide film 52 is formed on, for example, a SUS-made thin plate 51. Subsequently, as shown in FIG. 4B, the photosensitive polyimide film 52 is subjected to photolithography for patterning and thus the flexible insulating substrate 31 is formed to have an opening portion 32 at a region.

Next, as shown in FIG. 4C, a plating underlayer 53 made of Cr/Cu is formed by, for example, a sputtering method on a top surface of the flexible insulating substrate 31 including the opening portion 32. Subsequently, as shown in FIG. 4D, the surface of the underlayer 53 is coated with a resist film, which is further subjected to photolithography, thereby forming a plating resist pattern 54 having a circuit pattern forming section exposed. After that, for example, electric copper plating is carried out, in which the SUS-made thin plate 51 and the underlayer 53 are used as common electrodes, thereby forming a Cu pattern 55. Then, as shown in FIG. 4E, the resist pattern 54 is removed.

Next, as shown in FIG. 4F, the underlying layer 53 is selectively removed by etching using the Cu patter 55 as the mask, thereby forming a circuit pattern 33 having a layered structure of Cr/Cu and Cu. Subsequently, electroless Ni plating is carried out to form a Ni thin film 35 on exposed surface portions of the circuit pattern 33 as shown in FIG. 4G. After that, a coverlay 36 made of, for example, polyimide, is formed on the flexible insulating substrate 31 expect for the opening portion 32.

Figure 4J:
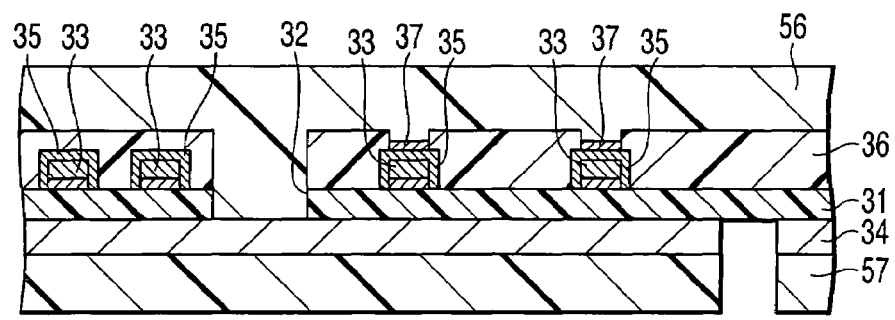
Figure 4K:
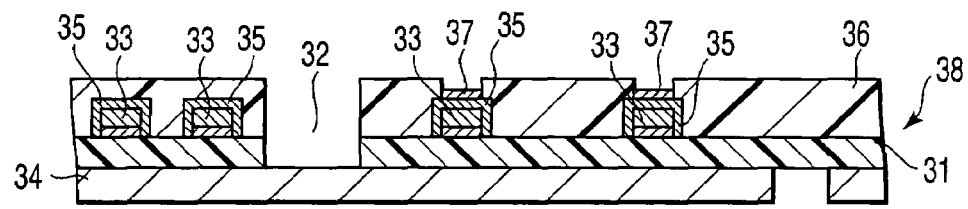
Figure 4L:
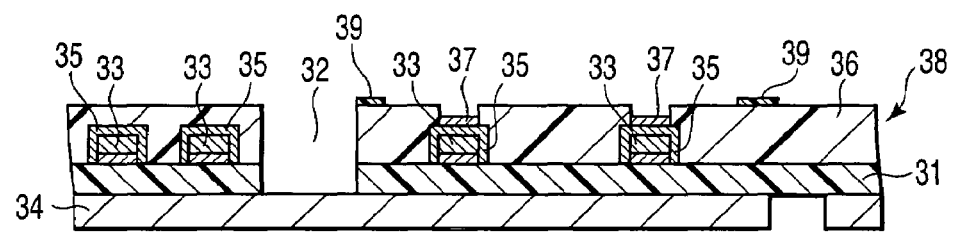

Next, as shown in FIG. 4H, the coverlay portion 36 that covers the surface of the circuit pattern 33 of a predetermined form is selectively removed to expose the Ni thin film 35 on the circuit pattern 33. After that, the resultant is subjected to electroless Ni plating and electroless Au plating. Thus, as shown in FIG. 4I, a Ni/Au thin film 37 is formed on the exposed portions of the Ni thin film 35. Subsequently, as shown in FIG. 4J, a resist film 56 is applied on the entire surface of the coverlay 36. Further, a resist film is applied on a bottom surface of the SUS-made thin plate 51, which is further subjected to photolithography, thereby forming a resist pattern 57. With use of the resist pattern 57 as the mask, the SUS-made thin plate 51 is selectively removed by etching to form the backing plate 34. After that, the resist film 56 and resist pattern 57 are removed, and thus a flexible printed wiring board (FPC) 38 as shown in FIG. 4K is manufactured. Subsequently, as shown in FIG. 4L, the fluororesin film 39 is formed on portions of the coverlay 36, which are located in vicinities of the regions where the active element parts are mounted. The fluororesin film 39 can be formed by employing a method of adhering a film-type fluororesin of a desired pattern on the coverlay 36 with an adhesive or a method of applying a fluororesin solution on the coverlay 36 with a printing technique, followed by printing.

Figure 4M:
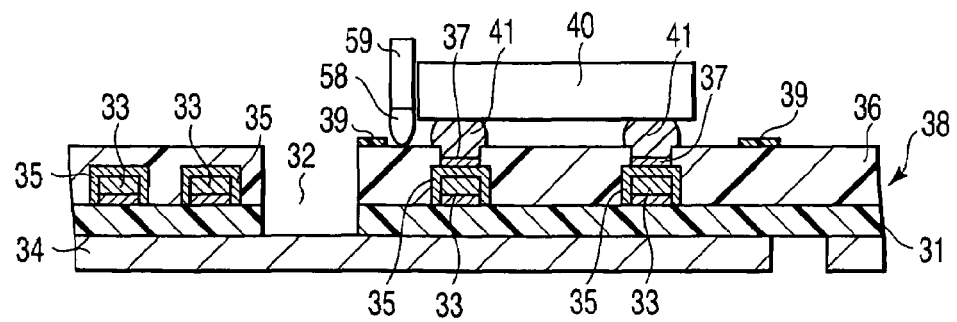

After that, as shown in FIG. 4M, the electrode (not shown) of the active element part such as bare chip 40 is connected by the solder material 41 to the Ni/Au thin film 37 on the circuit pattern 33, which is exposed from an opening (mount region) of the cover lay 36 of the FPC 38. In this mount region, an underfill-forming resin solution (for example, a solution of epoxy resin containing a filler) 58 is dropped from, for example, a dispense nozzle 59 into a gap between the coverlay 36 and the bare chip 40, followed by drying and curing. In this manner, an underfill 42 is formed to mechanically fix the bare chip 40 to the coverlay 36, as shown in FIG. 3 described above. Thus, a flexible module substrate in which the bare chip 40 and the like are mounted on the FPC 38 is manufactured.

As described above, according to the second embodiment, the portions of the coverlay 36 of the flexible printed wiring board (FPC) 38, which are located in the vicinities of at least the active element parts mount regions are coated with the fluororesin film 39 that is hard to get wet and has a high water repellency. With this structure, it is possible to prevent the underfill 42 from spreading from the mount region of the bare chip 40 of the FPC 38 to the peripheral parts during the operation of connecting the electrode of the active element part (such as bare chip) 40 via the solder material 41 to the Ni/Au thin film 37 of the circuit pattern 33 to mechanically fix the bare chip 40 to the coverlay 36 with underfill 42 in the respective mount region. Therefore, there is no need to provide a dam or trench to prevent the flow-out of the solution unlike the conventional technique, and it is possible to narrow the interval between parts. Consequently, it is possible to realize a module substrate in which bare chip 40 and the like are mounted at a high density.

Further, in the module substrate in which the active element parts (for example, bare chip) 40 are mounted in the FPC 38, it is possible to prevent the underfill 42, made of a cured resin as its main component and having a hard property, from spreading from the mount region of the bare chip 40 to the coverlay 36, located in its periphery. Therefore, the creation of dust, which is caused by peeling off of the spread portion, if any, of the underfill when the wiring board is bent at a part near the mount region of the bare chip 40, can be prevented. Thus, in the case of a disk apparatus, it is possible to avoid a medium loaded in the apparatus from being adversely affected.

Furthermore, the backing plate 34 is provided on the bottom surface of the flexible insulating substrate 31 at a position to oppose at least the bare chip 40. With this structure, the flexibility of the portion of the insulating substrate 31, where the bare chip 40 is mounted, can be suppressed, and therefore it is possible to properly fix the bare chip 40 to the FPC 38.

It should be noted that in the manufacture of the FPC in the second embodiment, it is alternatively possible to use a copper foiled polyimide film as the starting material.

Third Embodiment

Figure 6:
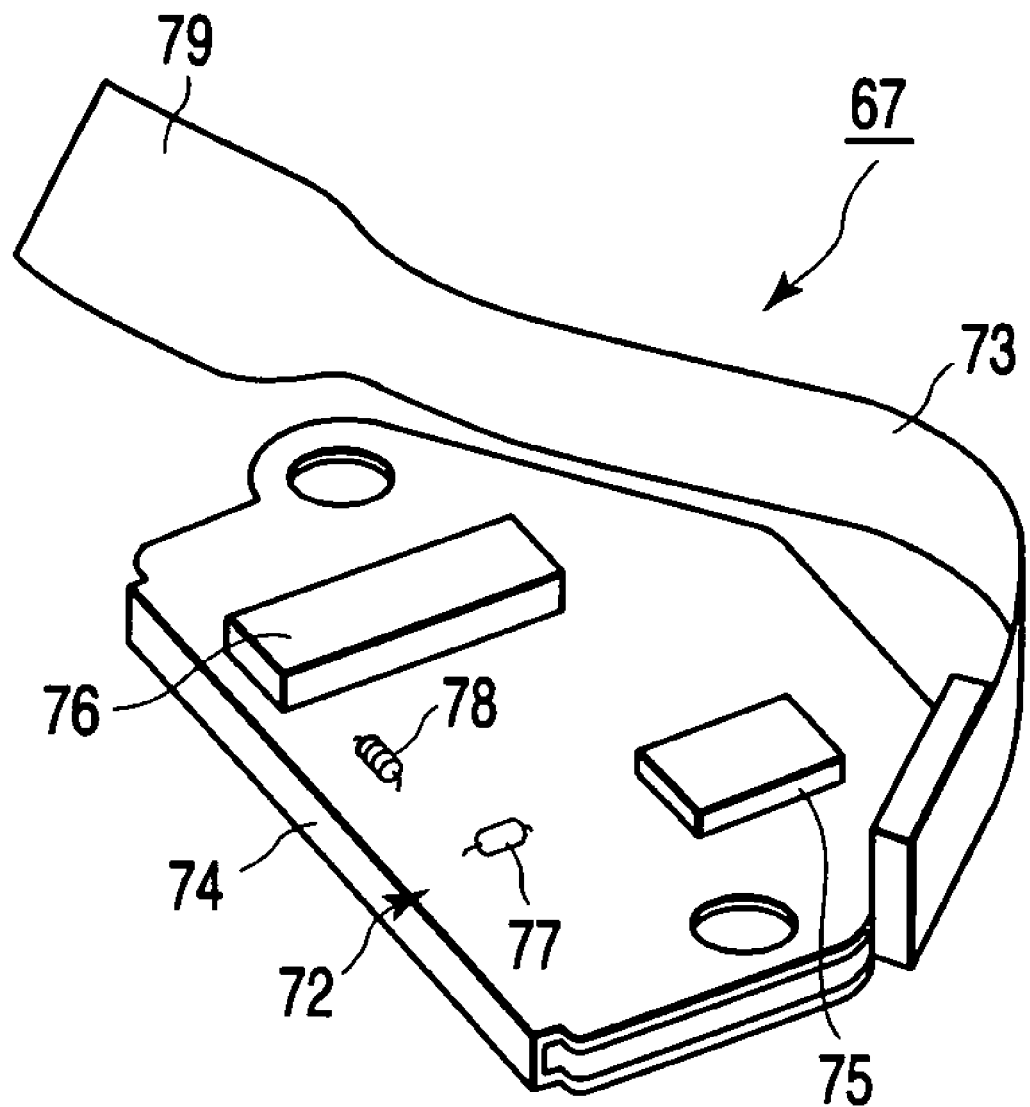
FIG. 6 is an exemplary perspective view showing a flexible module substrate shown in FIG. 5.

FIG. 5 is an exemplary perspective view showing a hard disk drive (to be called HDD hereinafter) serving as a disk apparatus according to a third embodiment of the present invention, and FIG. 6 is an exemplary perspective view showing a flexible module substrate shown in FIG. 5.

As shown in FIG. 5, the HDD includes a case 61 having a rectangular box shape with an upper surface opened, and a top cover to open/close the opened upper end of the case, which is fixed to the case with a plurality of screws.

The case 61 contains two magnetic disks 62a and 62b serving as recording media, a spindle motor 63 serving as a drive member for supporting and rotating these magnetic disks, a plurality of magnetic heads that record data on a magnetic disk or reproduce data therefrom, a head actuator 64 that supports these magnetic heads to be movable with respect to the magnetic disks 62a and 62b, a voice coil motor (to be called VCM hereinafter) that rotationally moves and positions the head actuator 64, a ramp load mechanism 66 that maintains the respective magnetic head at a position distant from a respective magnetic disk when the magnetic head moves to the outermost circumference of the magnetic disk, and a flexible module substrate 67 in which electronic parts such as pre-amplifiers, bare chips and the like are mounted.

Further, a printed wiring board (not shown) that controls the operations of the spindle motor 63, the VCM 65 and the magnetic heads via the flexible module substrate 67 is fixed with screws to the outer surface of the case 61, so as to be located at a position opposing the bottom wall of the case 61.

The two magnetic disks 62a and 62b are fitted with a hub (not shown) of the spindle motor 63 to be coaxial with each other, and further they are clamped with a clamping spring 68 to be stacked in an axial direction of the hub with a predetermined interval therebetween. The magnetic disks 62a and 62b are rotated by the spindle motor 63 at a predetermined speed.

The head actuator 64 includes a bearing assembly 69 fixed on the bottom wall of the case 61. Further, the head actuator 64 includes a plurality of, for example, four arms 70 mounted to a hub (not shown) of the bearing assembly 69, magnetic heads 71 each supported at an extending end of a suspension (not shown) extending from each of the arms 70, and three spacer rings (not shown).

On the other hand, each magnetic head 71 of the head actuator 64 is electrically connected to a main flexible printed wiring board, which will be described later, of an FM unit 67 via a respective flexible printed circuit board (not shown).

As shown in FIGS. 5 and 6, the flexible module substrate 67 includes a base member 72 having a flexible printed wiring board that is bent into a substantially rectangular shape, and a belt-like a flexible printed wiring board 73 that is bent and extended from the flexible printed wiring board of the base member to be connected to the head actuator 64. Thus, it is formed as an integral member of the common flexible printed wiring boards.

The base member 72 has a structure substantially similar to the flexible module substrate shown in FIG. 3 of the second embodiment described above. More specifically, the flexible printed wiring board 74 includes a flexible insulating substrate made of, for example, polyimide and having an opening at a region, a circuit pattern formed on the flexible insulating substrate and having a layered structure of, for example, Cr/Cu and Cu, a backing plate made of, for example, SUS formed on a bottom surface of the flexible insulating substrate (at least a section corresponding to an active element part, which will be described later), a thin film of, for example, Ni, that covers exposed surface portions of the circuit pattern 33, a coverlay made of, for example, polyimide, which serves as a protective film, and is formed on the flexible insulating substrate 31 except for the openings, and a Ni/Au thin film formed at each of opening portions of the coverlay of the circuit pattern, where active element parts are mounted. A fluororesin is formed on the surface of the coverlay in the vicinities of the mount regions. An active element part (for example, head amplifier) 75 is connected to the circuit pattern exposed from the coverlay in a respective mount region, and it is mechanically fixed to the coverlay with an underfill. Further, a connector 76, chip resistor 77 and chip capacitor 78 are mounted on the flexible printed wiring board 74. It should be noted that a backing plate made of, for example, SUS, is provided on an opposite side of the flexible printed wiring board 74, where the head amplifier 75 and the like are mounted, in such a manner that the backing plate opposes the head amplifier 75 and connector 77. The base member 72 is fixed to the bottom wall of the case 61. An extending end of the belt-like a flexible printed wiring board 73 extending from the base member forms a connecting end portion 79. The connecting end portion 79 is mounted on the proximal end portion side of the head actuator 64.

An HDD having the above-described structure has the following advantages. That is, in the base member 72 of the flexible module substrate 67 having such a structure that the active element part (for example, head amplifier) 75 is mounted to the circuit pattern exposed from the coverlay (protection film) of the flexible printed wiring board 74, and the head amplifier 75 is mechanically fixed to the coverlay with the underfill, the fluororesin is applied onto the surface of the coverlay portions in the vicinities of the mount regions, to prevent the underfill from spreading to the peripheral portions. In this manner, the mounting density of the head amplifier 75 and the like can be improved.

Further, in the base member, the underfill made of a cured resin as its main component and having a hard property is prevented from spreading to the peripheral portions (including the bent section of the belt-like flexible printed wiring board 73, which is connected to the head actuator 64 from the base member 72). In this manner, the underfill is not located at the bent section. Therefore, the possibility of peeling-off of the underfill can be suppressed. Therefore, the belt-like flexible printed wiring board 73 can be smoothly bent from the base member 72 without creating dust, which is caused by the peeling-off of the underfill.

Therefore, it is possible to realize an HDD comprising the flexible module substrate 67 including the base member 72 which can mount parts at a high density and has a high reliability.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A module substrate comprising:
   an insulating substrate;
   a circuit pattern formed on at least outermost surface of the insulating substrate;
   a solder resist film formed on the outermost surface of the insulating substrate including the circuit pattern, and having at least one opening located in a mount region of the circuit pattern;
   an active element part mounted on the mount region of the circuit pattern;
   a fluororesin film formed on the solder resist film at least in a vicinity of the mount region of the active element part; and
   an underfill filled between the active element part and the mount region of the circuit pattern.

2. The module substrate according to claim 1, wherein the insulating substrate is a rigid insulating substrate made of a thermosetting resin as a main component.

3. The module substrate according to claim 1, wherein the circuit patterns are formed on the main surface of the insulating substrate and an opposing surface to the main surface, respectively.

4. The module substrate according to claim 1, wherein the insulating substrate is a flexible insulating substrate.

5. The module substrate according to claim 4, wherein a backing plate is further provided on the opposing surface of the insulating substrate to the circuit pattern, such as to face the active element part.

6. The module substrate according to claim 1, wherein the active element part is a bare chip.

7. The module substrate according to claim 1, wherein the fluororesin film has a thickness of 5 to 50 microns (μm).

8. The module substrate according to claim 1, wherein the underfill is made of an epoxy resin containing a filler.

9. The module substrate according to claim 1, wherein a passive element part is further mounted on the circuit pattern.

10. A disk apparatus comprising:
    a disk-shaped recording medium;
    a drive member that supports and rotates the recording medium;
    a head actuator that supports the head and moves the head in relation to the recording medium; and
    a flexible module substrate containing a base member including a flexible printed wiring board and a belt-like flexible printed wiring board bent and extending from the flexible printed wiring board of the base member and connected to the head actuator;
    wherein the base member of the flexible module substrate comprises; and insulating substrate; a circuit pattern formed on at least an outermost surface of the insulating substrate; a solder resist film formed on the outermost surface of the insulating substrate including the circuit pattern, and having at least one opening located in a mount region of the circuit pattern; an active element part mounted on the region of the circuit pattern; a fluororesin film formed on the solder resist film at least in a vicinity of the mount region of the active element part; and an underfill filled between the active element part and the mount region of the circuit pattern.

11. The disk apparatus according to claim 10, wherein the active element part of the base member is a bare chip.

12. The disk apparatus according to claim 10, wherein the fluororesin film of the base member has a thickness of 5 to 50 microns (μm).

13. The disk apparatus according to claim 1, wherein the underfill of the base member is made of an epoxy resin containing a filler.

14. The disk apparatus according to claim 10, wherein a passive element part is further mounted on the circuit pattern of the base member.

15. The disk apparatus according to claim 10, wherein a backing plate is further provided on the opposing surface of the flexible insulating substrate to the circuit pattern of the base member, such as to face the active element part.

* * * * *